(12) United States Patent
Masagaki

(10) Patent No.: US 9,319,646 B2
(45) Date of Patent: Apr. 19, 2016

(54) SOLID STATE IMAGING DEVICE HAVING A SHARED PIXEL STRUCTURE AND ELECTRONIC APPARATUS

(71) Applicant: Sony Corporation, Tokyo (JP)

(72) Inventor: Atsushi Masagaki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/308,921

(22) Filed: Jun. 19, 2014

(65) Prior Publication Data

US 2015/0002709 A1 Jan. 1, 2015

(30) Foreign Application Priority Data

Jun. 26, 2013 (JP) ................................. 2013-133669

(51) Int. Cl.
*H04N 5/335* (2011.01)
*H04N 9/04* (2006.01)
*H04N 5/3745* (2011.01)

(52) U.S. Cl.
CPC ........... *H04N 9/045* (2013.01); *H04N 5/37457* (2013.01)

(58) Field of Classification Search
CPC ...................................................... H04N 9/045
USPC ................................................. 348/280, 281
See application file for complete search history.

(56) References Cited

U.S. PATENT DOCUMENTS

| 2007/0177044 | A1* | 8/2007 | Maruyama et al. | 348/308 |
|---|---|---|---|---|
| 2009/0051801 | A1* | 2/2009 | Mishina et al. | 348/311 |
| 2009/0173974 | A1* | 7/2009 | Shah et al. | 257/292 |
| 2009/0200451 | A1* | 8/2009 | Conners | 250/208.1 |
| 2009/0225209 | A1* | 9/2009 | Arakawa | 348/306 |
| 2010/0194936 | A1* | 8/2010 | Kanbe | 348/243 |
| 2010/0245648 | A1* | 9/2010 | Tayanaka et al. | 348/308 |
| 2011/0073923 | A1* | 3/2011 | Tatani et al. | 257/291 |
| 2011/0127408 | A1* | 6/2011 | Yanagita et al. | 250/208.1 |
| 2011/0181747 | A1* | 7/2011 | Kido et al. | 348/222.1 |
| 2012/0028060 | A1* | 2/2012 | Etzel et al. | 428/473.5 |
| 2012/0033119 | A1* | 2/2012 | Shinohara | 348/302 |
| 2012/0133800 | A1* | 5/2012 | Jung et al. | 348/241 |
| 2012/0228473 | A1* | 9/2012 | Yoshitsugu | 250/208.1 |
| 2012/0268566 | A1* | 10/2012 | Kim et al. | 348/46 |
| 2013/0049082 | A1* | 2/2013 | Kato et al. | 257/292 |
| 2013/0161487 | A1* | 6/2013 | Sakaguchi et al. | 250/208.1 |
| 2013/0264468 | A1* | 10/2013 | Kobayashi et al. | 250/208.1 |

(Continued)

FOREIGN PATENT DOCUMENTS

| JP | 2008-172580 A | 7/2008 |
|---|---|---|
| JP | 2010-141638 A | 6/2010 |

(Continued)

*Primary Examiner* — Usman Khan
(74) *Attorney, Agent, or Firm* — Sheridan Ross P.C.

(57) ABSTRACT

A solid state imaging device includes a pixel array unit in which color filters of a plurality of colors are arrayed with four pixels of vertical 2 pixels×horizontal 2 pixels as a same color unit that receives light of the same color, shared pixel transistors that are commonly used by a plurality of pixels are intensively arranged in one predetermined pixel in a unit of sharing, and a color of the color filter of a pixel where the shared pixel transistors are intensively arranged is a predetermined color among the plurality of colors. The present technology can be applied, for example, to a solid state imaging device such as a back-surface irradiation type CMOS image sensor.

14 Claims, 15 Drawing Sheets

(56) References Cited

U.S. PATENT DOCUMENTS

2014/0239433 A1* 8/2014 Wakano .................. 257/443
2014/0267828 A1* 9/2014 Kasai et al. ............. 348/229.1

FOREIGN PATENT DOCUMENTS

| | | |
|---|---|---|
| JP | 2012-023389 A | 2/2012 |
| JP | 2012-104979 A | 5/2012 |

* cited by examiner

SOLID STATE IMAGING DEVICE HAVING A SHARED PIXEL STRUCTURE AND ELECTRONIC APPARATUS

CROSS REFERENCE TO RELATED APPLICATIONS

This application claims the benefit of Japanese Priority Patent Application JP 2013-133669 filed Jun. 26, 2013, the entire contents of which are incorporated herein by reference.

BACKGROUND

The present technology relates to a solid state imaging device and an electronic apparatus, particularly to a solid state imaging device and an electronic apparatus that can realize a configuration in which an area of a photodiode can be expanded and which can be used in any of a front-surface irradiation type and a back-surface irradiation type.

In a complementary metal oxide semiconductor (CMOS) image sensor, in addition to a photodiode and a floating diffusion region (FD), a plurality of pixel transistors (so-called MOS transistors) are formed in a pixel unit. The plurality of pixel transistors include, for example, a transfer transistor that transfers accumulated charge of the photodiode to the FD, a selection transistor that controls a selection state of the pixels, a reset transistor that resets the charge, an amplification transistor, and the like.

In addition, in recent years, with the advance in miniaturization of the pixels, a shared pixel structure in which a part of pixel transistors is shared by a plurality of pixels is also proposed (for example, refer to Japanese Unexamined Patent Application Publication Nos. 2012-23389 and 2010-141638). In the shared pixel structure, for example, by the FD, the selection transistor, the reset transistor, and the amplification transistor being shared in a plurality of pixels, an area of the pixel transistors arranged in each pixel can be decreased and it is possible to ensure the maximum area of the photodiode which has an effect on the imaging characteristics such as a saturation charge amount and a sensitivity.

Furthermore, a technology to realize a wide dynamic range by increasing a junction capacitance per unit area using the miniaturization of the pixel to improve the saturation charge amount and sequentially read out, is proposed (for example, refer to Japanese Unexamined Patent Application Publication No. 2012-104979).

In addition, in the back-surface irradiation type CMOS image sensor, a technology to further maximize the area of the photodiode by intensively arranging the pixel transistors shared in the plurality of pixels only on B pixels that receive blue light having less transmission light is proposed (for example, refer to Japanese Unexamined Patent Application Publication No. 2008-172580).

SUMMARY

However, due to the structure, since the technology disclosed in Japanese Unexamined Patent Application Publication No. 2008-172580 can be adopted only to the back-surface irradiation type CMOS image sensor, a structure which can be used in both of the front-surface irradiation type and the back-surface irradiation type is desired.

The present technology can realize the configuration in which the area of the photodiode can be expanded and which can be used in both of the front-surface irradiation type and the back-surface irradiation type.

A solid state imaging device according to an embodiment of the present technology includes a pixel array unit in which color filters of a plurality of colors are arrayed with four pixels of vertical 2 pixels×horizontal 2 pixels as a same color unit that receives light of the same color, shared pixel transistors that are commonly used by a plurality of pixels are intensively arranged in one predetermined pixel in a unit of sharing, and a color of the color filter of a pixel where the shared pixel transistors are intensively arranged is a predetermined color among a plurality of the colors.

An electronic apparatus according to another embodiment of the present technology includes a solid state imaging device that has a pixel array unit in which color filters of a plurality of colors are arrayed with four pixels of vertical 2 pixels×horizontal 2 pixels as a same color unit that receives light of the same color, shared pixel transistors that are commonly used by a plurality of pixels are intensively arranged in one predetermined pixel in a unit of sharing, and a color of the color filter of a pixel where the shared pixel transistors are intensively arranged is a predetermined color among the plurality of colors.

In the pixel array unit according to the embodiments of the present technology, the color filters of the plurality of colors are arrayed with four pixels of vertical 2 pixels×horizontal 2 pixels as the same color unit that receives light of the same color, the shared pixel transistors that are commonly used by the plurality of pixels are intensively arranged in the one predetermined pixel in the unit of sharing, and the color of the color filter of the pixel where the shared pixel transistors are intensively arranged is the predetermined color among a plurality of the colors.

The solid state imaging device and the electronic apparatus may be an independent device, or may be a module to be incorporated into other devices.

According to the embodiments of the present technology, it is possible to realize the configuration in which the area of the photodiode can be expanded and which can be used in both of the front-surface irradiation type and the back-surface irradiation type.

BRIEF DESCRIPTION OF THE DRAWINGS

FIG. 4 is a diagram illustrating a schematic pixel layout in which FIG. 3 is simplified.

FIG. 7 is a diagram illustrating a schematic pixel layout in which FIG. 6 is simplified.

DETAILED DESCRIPTION OF EMBODIMENTS

Figure 1:
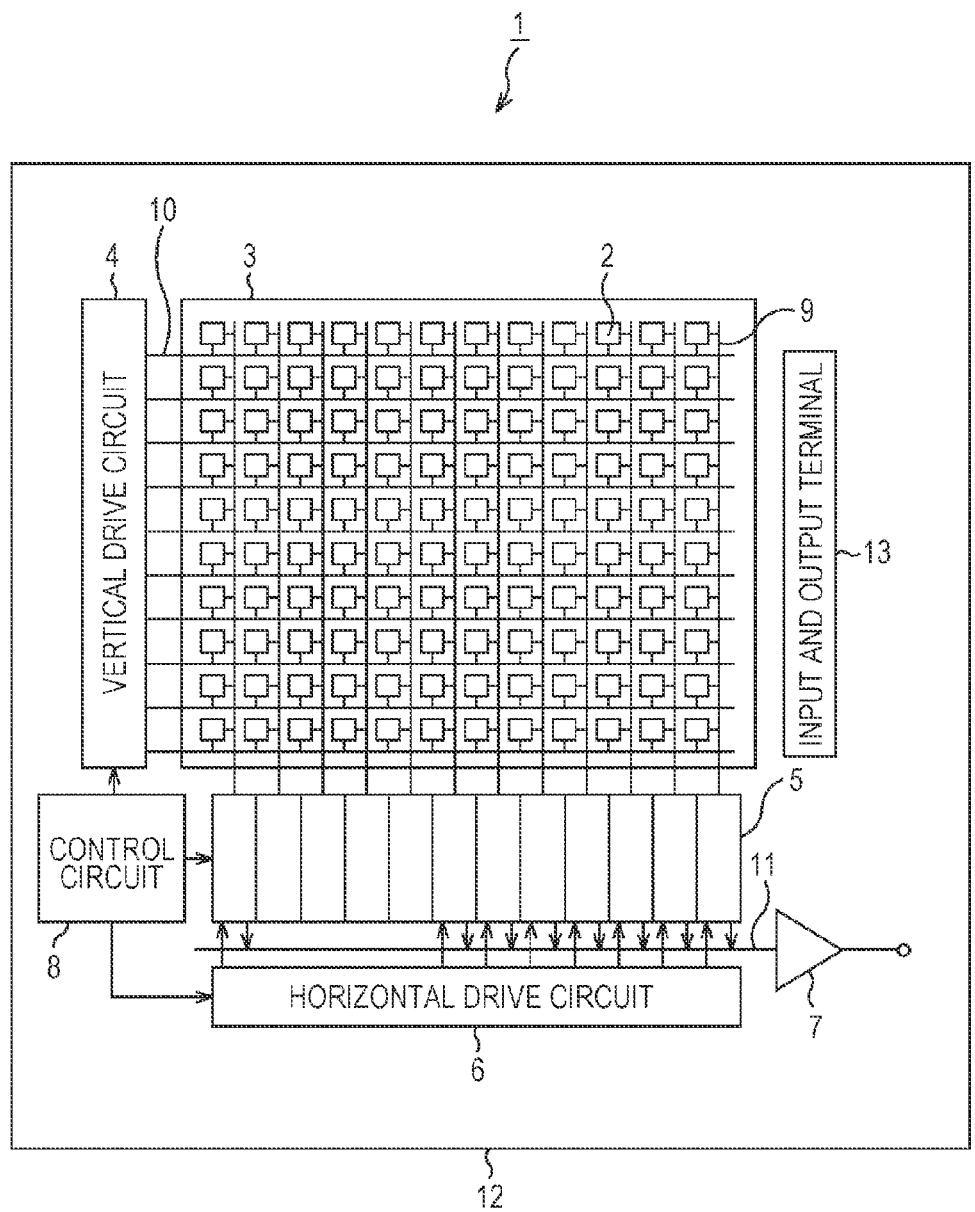
FIG. 1 is a diagram illustrating a schematic configuration of a solid state imaging device to which the present technology is applied.

Hereinafter, embodiments for implementing the present technology (hereinafter, referred to as the embodiment) will be described. The description will be made in an order as follows.

1. A schematic configuration example of a solid state imaging device
2. An example of a shared pixel structure in the related art
3. A shared pixel structure in the present embodiments
4. An example of arranging color filters and an on-chip lens
5. First to third examples of arranging a shared pixel transistor
6. A configuration example of an electronic apparatus 1. A Schematic Configuration Example of a Solid State Imaging Device FIG. 1 is a diagram illustrating a schematic configuration of a solid state imaging device to which the present technology is applied.

The solid state imaging device 1 in FIG. 1 is configured to include a pixel array unit 3 in which pixels (pixel region) 2 are arrayed in a matrix shape and a peripheral circuit unit around the pixel array unit 3 on a semiconductor substrate 12 using, for example, silicon (Si) as the semiconductor. The peripheral circuit unit includes a vertical drive circuit 4, a column signal processing circuit 5, a horizontal drive circuit 6, an output circuit 7, and a control circuit 8.

In the pixel 2 in the pixel array unit 3, a so-called shared pixel structure in which a part of pixel transistors (so-called MOS transistors) is shared by a plurality of pixels 2 is adopted. Specifically, a structure in which a floating diffusion region (FD), a selection transistor, a reset transistor, and an amplification transistor are shared by vertical 4 pixels×horizontal 2 pixels, a total of 8 pixels (4 rows, 2 columns), is adapted. A plural pixel shared structure adapted in the present embodiment will be described below in detail with reference to FIGS. 5 to 7.

The control circuit 8 receives data for instructing an input clock, an operation mode, and the like, and outputs data such as internal information of the solid state imaging device 1. That is, the control circuit 8 generates a clock signal which is a standard for operation of the vertical drive circuit 4, the column signal processing circuit 5, and the horizontal drive circuit 6, and control signals based on a vertical synchronization signal, a horizontal synchronization signal, and a master clock. Then, the control circuit 8 outputs the generated clock signal and the control signals to the vertical drive circuit 4, the column signal processing circuit 5, and the horizontal drive circuit 6.

The vertical drive circuit 4, for example, is configured with a shift register, selects a pixel drive wiring 10, supplies a pulse for driving the pixel 2 to the selected pixel drive wiring 10, and drives the pixels 2 in units of a row. In other words, the vertical drive circuit 4 selectively and sequentially scans each pixel 2 of the pixel array unit 3 in units of a row in a vertical direction, and supplies the pixel signal which is based on a signal charge generated according to an amount of light received by the photoelectric conversion unit of each pixel 2, to the column signal processing circuit 5 through a vertical signal line 9.

The column signal processing circuit 5 is arranged for each column of pixel 2, and performs signal processing such as noise removal on the signal output from one row of the pixels 2 for each pixel column. For example, the column signal processing circuit 5 performs signal processing such as a correlated double sampling (CDS) for removing a specific fixed pattern noise of the pixel and an AD conversion.

The horizontal drive circuit 6, for example, is configured from a shift register, selects each column signal processing circuit 5 in an order by sequentially outputting horizontal scanning pulses, and causes each column signal processing circuit 5 to output the pixel signal to a horizontal signal line 11.

The output circuit 7 performs predetermined signal processing with respect to the signals sequentially supplied from each column signal processing circuit 5 through the horizontal signal line 11 to output. The output circuit 7, for example, in some cases, performs only a buffering, and in some cases, performs a black level adjustment, a column variation correction, various digital signal processing, and the like. An input and output terminal 13 exchanges the signals to and from the outside.

The solid state imaging device 1 configured as described above is a CMOS image sensor called a column AD type in which the column signal processing circuit 5 that performs the CDS processing and the AD conversion processing is arranged for each pixel column.

2. An Example of a Shared Pixel Structure in the Related Art

Next, a shared pixel structure in the related art will be described with reference to FIGS. 2 to 4 before describing a shared pixel structure adapted in the solid state imaging device 1 in FIG. 1.

Figure 2:
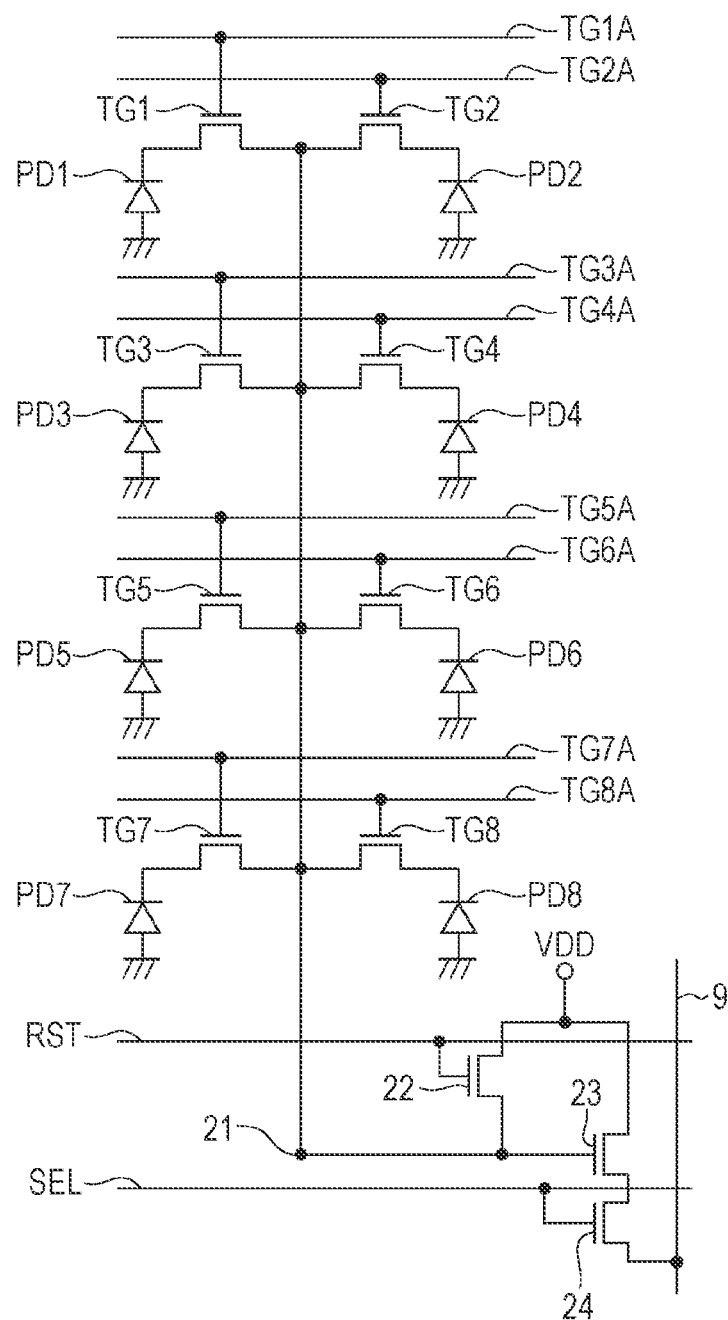
FIG. 2 is a circuit diagram of a shared pixel structure in the related art.

FIG. 2 illustrates a circuit diagram of a shared pixel structure in the related art in which a part of pixel transistors is shared by vertical 4 pixels×horizontal 2 pixels, a total of 8 pixels.

Each pixel individually has only a photodiode PD and a transfer transistor TG that transfers charge accumulated in the photodiode PD. Then, the FD 21, the reset transistor (reset Tr) 22, the amplification transistor (amplification Tr) 23, and the selection transistor (selection Tr) 24 are commonly used respectively, in the 8 pixels which are a unit of sharing.

Hereinafter, each of the reset transistor 22, the amplification transistor 23, and the selection transistor 24 which are commonly used in the 8 pixels which are the unit of sharing is called a shared pixel transistor. In addition, in order to distinguish the photodiode PD and the transfer transistor TG individually arranged to each of the 8 pixels in the unit of sharing, as illustrated in FIG. 2, the photodiode PD and the transfer transistor TG are referred to as the photodiodes PD1 to PD8 and the transfer transistors TG1 to TG8.

Each photodiode PD1 to PD8 receives light to generate and accumulate the light charges.

The transfer transistor TG1 transfers the light charges accumulated in the photodiode PD1 to the FD 21 by becoming a conductive state in response to a drive signal when the drive signal supplied to a gate electrode via the signal line TG1A is in an active state. The transfer transistor TG2 transfers the light charges accumulated in the photodiode PD2 to the FD 21 by becoming a conductive state in response to the drive signal when the drive signal supplied to the gate electrode via the signal line TG2A is in an active state. The transfer transistor TG3 transfers the light charges accumulated in the photodiode PD3 to the FD 21 by becoming a conductive state in response to the drive signal when the drive signal supplied to the gate electrode via the signal line TG3A is in an active state. The transfer transistor TG4 transfers the light charges accumulated in the photodiode PD4 to the FD 21 by becoming a conductive state in response to the drive signal when the drive signal supplied to the gate electrode via the signal line TG4A is in an active state. The operation of the photodiodes PD5 to PD8 and the transfer transistors TG5 to TG8 as well is similar to that of the photodiodes PD1 to PD4 and the transfer transistors TG1 to TG4.

The FD 21 temporarily holds the light charges supplied from the photodiodes PD1 to PD8.

The reset transistor 22 resets the electric potential of the FD 21 to a predetermined level (reset voltage VDD) by becoming a conductive state in response to the drive signal when the drive signal supplied to the gate electrode via the signal line RST is in an active state.

The amplification transistor 23 configures a load MOS (not illustrated) of a constant current source circuit connected to one end of the vertical signal line 9 and a source follower circuit by a source electrode being connected to the vertical signal line 9 via the selection transistor 24.

The selection transistor 24 is connected between the source electrode of the amplification transistor 23 and the vertical signal line 9. The selection transistor 24 outputs the pixel signal of the pixels within the unit of sharing output from the amplification transistor 23 to the vertical signal line 9 with the sharing unit as the selected state by becoming a conductive state in response to the selection signal when the selection signal supplied to the gate electrode via the signal line SEL is in an active state. A plurality of pixels within the unit of sharing can output the pixel signal in one pixel unit, or can simultaneously output the pixel signal in a plurality of pixel units according to the drive signal from the vertical drive circuit 4.

Figure 3:
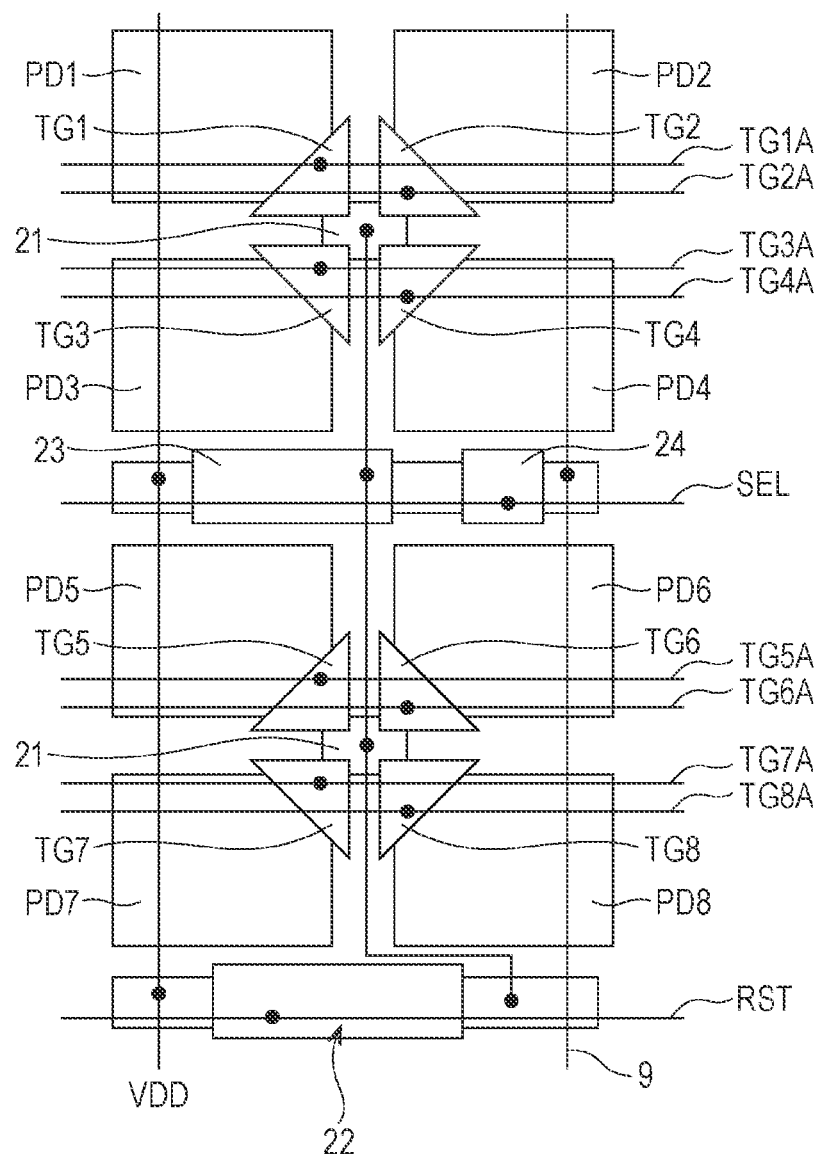
FIG. 3 is a diagram illustrating a pixel layout in the shared pixel circuit in the related art.

FIG. 3 illustrates the pixel layout in the shared pixel structure on the semiconductor substrate in the related art illustrated in FIG. 2. In FIG. 3, the same reference numerals are given to the parts corresponding to the parts in FIG. 2.

Figure 4:
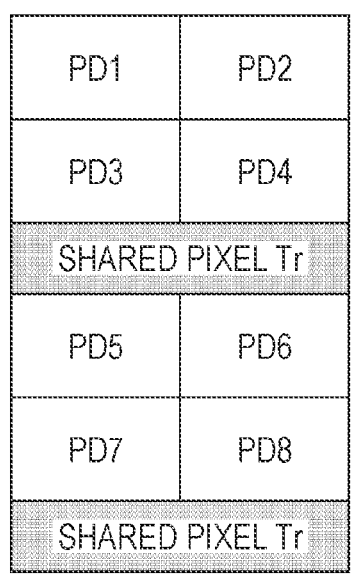

In addition, FIG. 4 illustrates a schematic pixel layout in which the pixel layout in FIG. 3 is further simplified with focusing on only the photodiodes PD and the shared pixel transistors.

The pixel layout in the shared pixel structure on the semiconductor substrate in the related art, as illustrated in FIG. 4, is a layout of arranging two configurations vertically (in a column direction), in which the photodiodes PD are arranged in vertical 2×horizontal 2 for each pixel, and the shared pixel transistors are arranged on the lower side thereof.

In one side of the arrangement region of the two shared pixel transistors, for example, as illustrated in FIG. 3, the amplification transistor 23 and the selection transistor 24 are arranged, and in the other side, the reset transistor 22 is arranged.

Then, in the arrangement region for each pixel of vertical 2 pixels×horizontal 2 pixels, as illustrated in FIG. 3, the photodiodes PD are arranged, and the FD 21 is arranged on the center of the 2×2 photodiodes. The FDs 21 are separately arranged in two positions on the center of the 2×2 photodiodes PD on the upper side and on the center of the 2×2 photodiodes on the lower side. In addition, in the vicinity of the FD 21 of each photodiode PD, (gate electrodes of) the transfer transistors TG provided for each pixel are arranged.

In the example in FIG. 3, among the two vertically arranged configurations, the photodiodes PD1 to PD4, the amplification transistor 23, and the selection transistor 24 are arranged on the upper side, and the photodiodes PD5 to PD8 and the reset transistor 22 are arranged on the lower side, but the method of arranging the shared pixel transistors is not limited thereto. For example, the reset transistor 22 and the amplification transistor 23 may be arranged on the lower side of the photodiodes PD1 to PD4, and the selection transistor 24 may be arranged on the lower side of the photodiodes PD5 to PD8.

In this way, in a case where the reset transistor 22, the amplification transistor 23, and the selection transistor 24 are shared by 8 pixels, the number of pixel transistors per pixel unit is 11/8=1.375 transistor. Therefore, according to the shared pixel structure, since it is possible to reduce the number of pixel transistors per unit pixel compared to a case where the reset transistor 22, the amplification transistor 23, and the selection transistor 24 are arranged for each pixel.

However, as is apparent from FIG. 4, according to the shared pixel structure in the related art, it is necessary to ensure a separate position for arranging the shared pixel transistor, and the area of such positions causes a reduction in area of the photodiodes PD of each pixel. In addition, due to miniaturization of the pixels, when the arrangement area of the shared pixel transistors is reduced, there is a concern that noise due to the reduction of the area for the amplification transistor 23 may increase.

3. A Shared Pixel Structure of the Solid State Imaging Device 1

Next, a shared pixel structure adapted in the solid state imaging device 1 in FIG. 1 will be described with reference to FIGS. 5 to 7.

Figure 5:
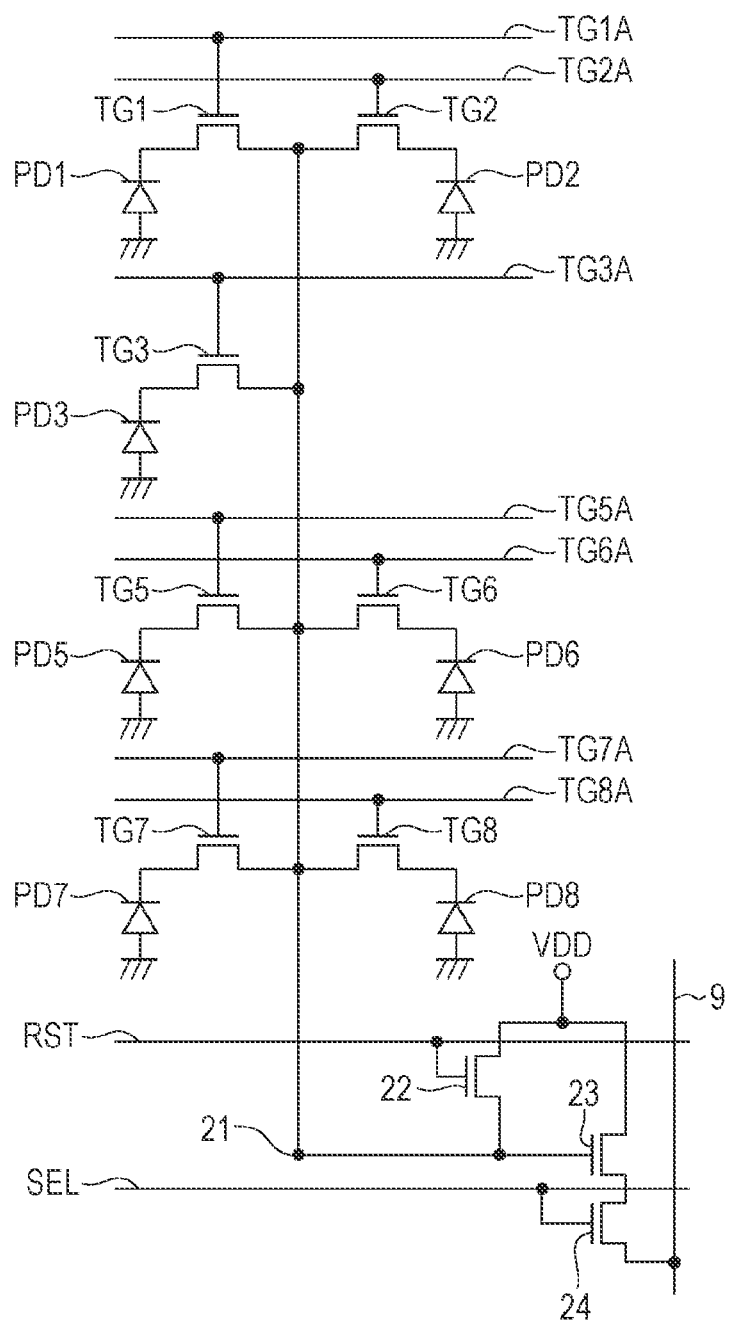
FIG. 5 is a circuit diagram of the shared pixel structure of the solid state imaging device in FIG. 1.
Figure 6:
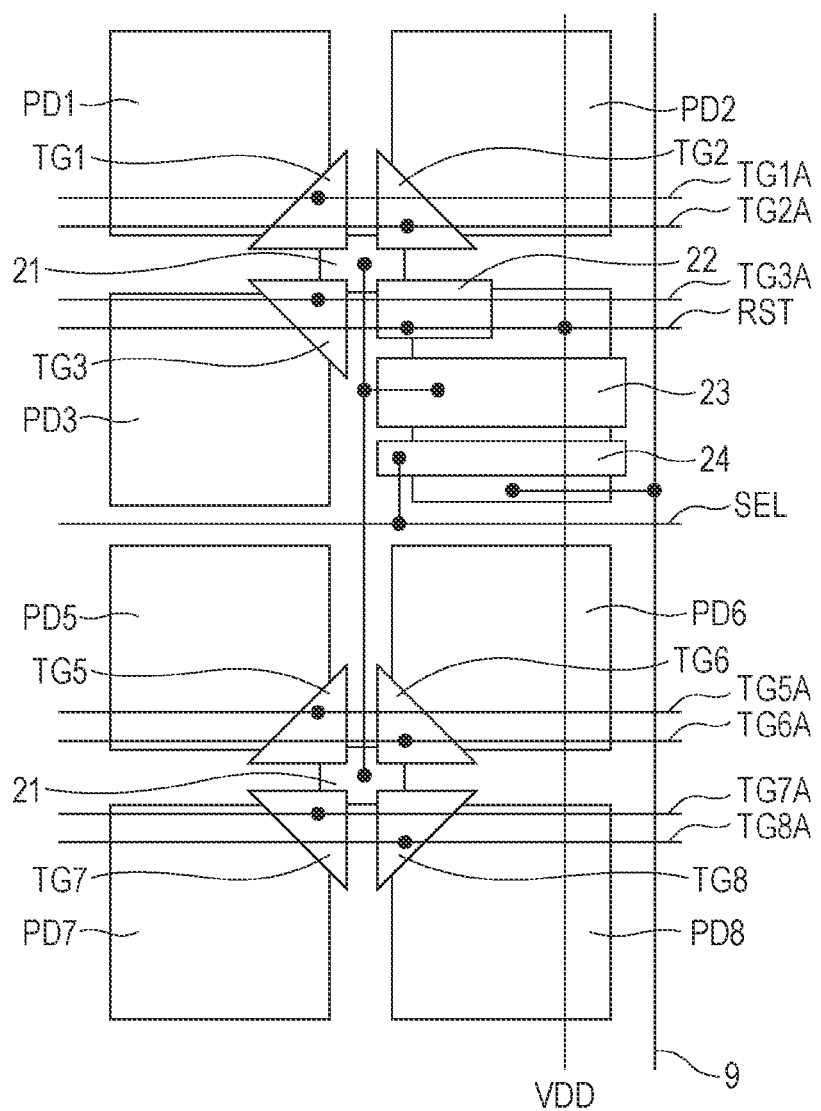
FIG. 6 is a diagram illustrating a pixel layout of the shared pixel circuit of the solid state imaging device in FIG. 1.
Figure 7:
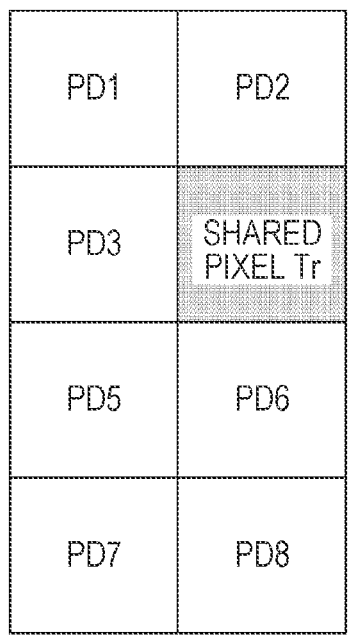

FIGS. 5 to 7 are diagrams illustrating the shared pixel structure adapted in the solid state imaging device 1 in association with FIGS. 2 to 4.

That is, FIG. 5 illustrates a circuit diagram of the shared pixel structure adapted in the solid state imaging device 1. FIG. 6 illustrates a pixel layout of the shared pixel structure in FIG. 5, on the semiconductor substrate 12. FIG. 7 illustrates a schematic pixel layout in which the pixel layout in FIG. 6 is further simplified.

The description of FIGS. 5 to 7 will be made only for the portion different from the shared pixel structure in the related art illustrated in FIGS. 2 to 4, and the description regarding the same portion will not be repeated.

In the circuit diagram of the shared pixel structure in the present embodiment illustrated in FIG. 5, compared to the circuit diagram of the shared pixel structure in the related art illustrated in FIG. 2, one photodiode PD and one transfer transistor TG among eight photodiodes PD and eight transfer transistors TG in the unit of sharing are omitted. In the example in FIG. 5, the photodiode PD4 and the transfer transistor TG4 are omitted.

Then, as illustrated in FIGS. 6 and 7, in the pixel layout in the present technology, all of the shared pixel transistors, that is, the reset transistor 22, the amplification transistor 23, and the selection transistor 24 are intensively arranged at the position where the photodiode PD4 and the transfer transistor TG4 are arranged in the related art.

As is apparent by comparing the schematic pixel layout in the present technology in FIG. 7 and the schematic pixel layout in the related art in FIG. 4, by intensively arranging all of the shared pixel transistors in the region of one pixel, it is possible to expand the area for other photodiodes PD in the unit of sharing. In other words, since it is not necessary to provide an arrangement position for the shared pixel transistors separate from the region for the photodiodes PD, it is possible to expand the area for the photodiodes PD1 to PD3 and the photodiodes PD5 to PD8.

In FIGS. 5 to 7, the example in which the photodiode PD4 and the transfer transistor TG4 among eight photodiodes PD and eight transfer transistors TG are omitted is described. However, the omitted photodiode PD and the transfer transistor TG can be any arbitrary one among eight photodiodes PD and eight transfer transistors TG. In other words, any arbitrary pixel in the region of the unit of sharing can be selected as one pixel on which the shared pixel transistors are intensively arranged.

4. An Example of Arranging Color Filters and an on-Chip Lens

Figure 8:
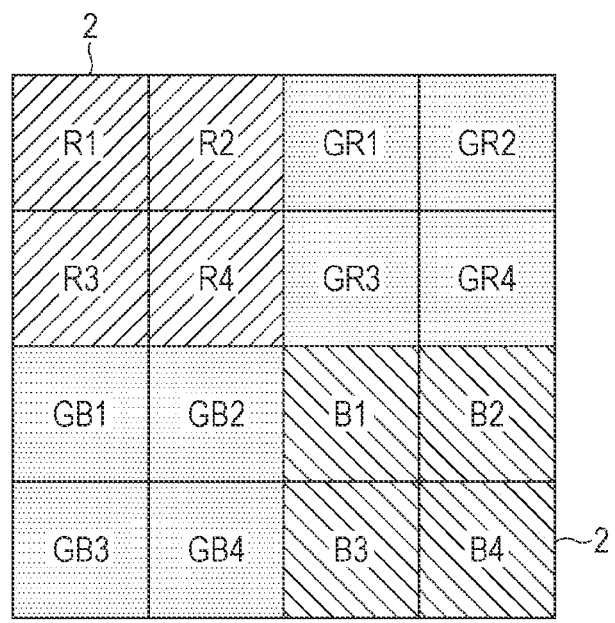
FIG. 8 is a diagram illustrating an example of arranging a color filter in the solid state imaging device in FIG. 1.

FIG. 8 illustrates an example of arranging color filters in the pixel array unit 3.

In the pixel array unit 3, the color filters of three colors, red (R), green (G), blue (B) are arranged in a so-called a Bayer array in which the colors are arranged in sets of R, G (GR), G (GB), and B such that the ratio R:G:B=1:2:1. However, each color of R, GR, GB, and B is arrayed in the unit of 4 pixels of vertical 2 pixels×horizontal 2 pixels as illustrated in FIG. 8. Therefore, if the unit of 4 pixels of vertical 2 pixels×horizontal 2 pixels which has the same color is referred to as a same color unit, a unit of sharing is configured in the solid state imaging device 1 in the same color unit of two colors adjacent in the vertical direction.

Hereinafter, the pixel 2 in which the color filter of R is arranged is referred to as R pixel, the pixel 2 in which the color filter of GR is arranged is referred to as GR pixel, the pixel 2 in which the color filter of GB is arranged is referred to as GB pixel, and the pixel in which the color filter of B is arranged is referred to as B pixel. In addition, in order to distinguish each of four R pixels in the same color unit, the R pixel in the upper left is referred to as an R1 pixel, the R pixel in the upper right is referred to as an R2 pixel, the R pixel in the lower left is referred to as an R3 pixel, and the R pixel in the lower right is referred to as an R4 pixel. Similarly, four GR pixels in the same color unit are referred to as a GR1 pixel, a GR2 pixel, a GR3 pixel, and a GR4 pixel respectively. Also similarly, four GB pixels are referred to as a GB1 pixel, a GB2 pixel, a GB3 pixel, and a GB4 pixel respectively, and four B pixels are referred to as a B1 pixel, a B2 pixel, a B3 pixel, and a B4 pixel respectively.

Figure 9:
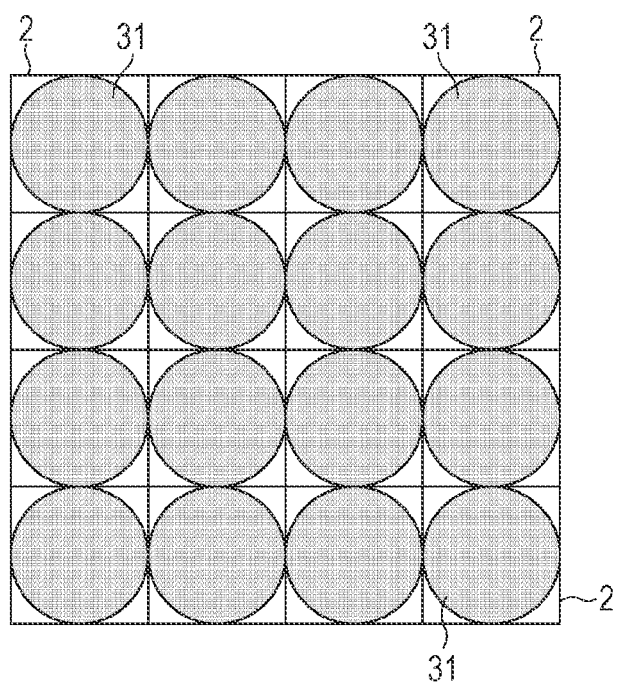
FIG. 9 is a diagram illustrating an example of forming an on-chip lens of the solid state imaging device in FIG. 1.

FIG. 9 illustrates an example of forming an on-chip lens in the pixel array unit 3.

As illustrated in FIG. 9, in the solid state imaging device 1, an on-chip lens (OCL) 31 is formed in the pixel unit.

In the solid state imaging device 1, as described above, by the color filters being arrayed in a unit of four pixels as vertical 2 pixels×horizontal 2 pixels, and by the pixel signal being read for each pixel, a junction capacitance of the photodiode PD per one pixel can be increased and it is possible to widen the dynamic range.

Compared to the general Bayer array in which the color filters of R, GR, GB, and B are arranged in a unit of one pixel, four pixels are recognized as one pixel having one color. However, in the latest high resolution solid state imaging devices 1, since the area per pixel is small enough, it is possible to obtain the sufficient resolution.

5.1 A First Example of Arranging Shared Pixel Transistors

Figure 10:
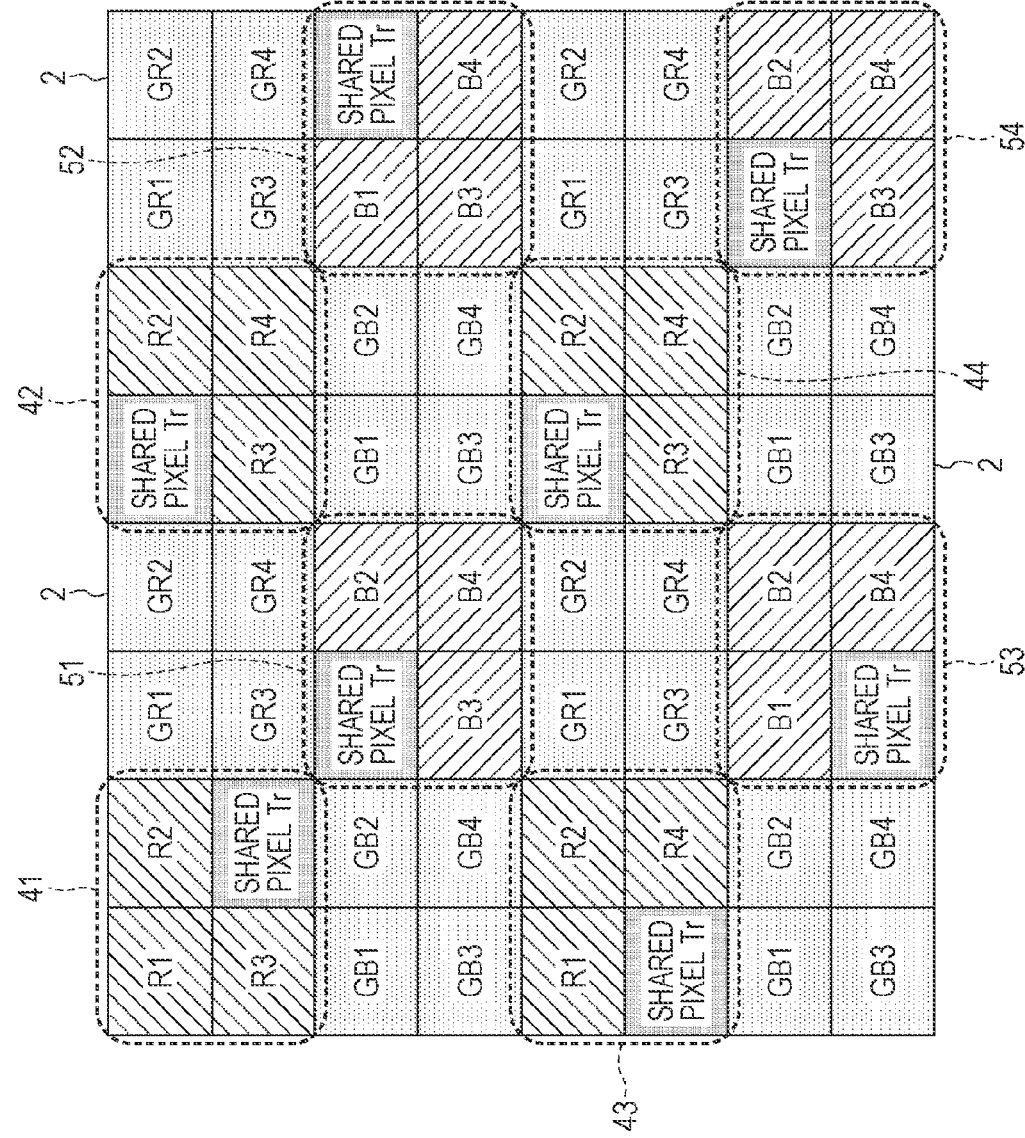
FIG. 10 is a diagram illustrating a first example of arranging a shared pixel transistor.

FIG. 10 is a diagram illustrating a first example of arranging shared pixel transistors in the pixel array unit 3.

In the first example of arrangement, as illustrated in FIG. 10, among each of the pixels 2 in which the color filters of R, GR, GB, and B are arranged so as to be the Bayer array with four pixels of vertical 2 pixels×horizontal 2 pixels as the same color unit that receives light of the same color, the shared pixel transistors are intensively arranged in one pixel of the R pixel and one pixel of the B pixel within the same color unit. In which one pixel the shared pixel transistors will intensively be arranged among four R pixels and four B pixels in the same color unit is determined at random.

That is, in FIG. 10, there are four R unit regions 41 to 44 as the same color unit regions of R. In the upper left R unit region 41 among the four R unit regions, the shared pixel transistors are intensively arranged at the position of R4 pixel, and in the upper right R unit region 42, the shared pixel transistors are intensively arranged at the position of R1 pixel. In addition, in the lower left R unit region 43, the shared pixel transistors are intensively arranged at the position of R3 pixel, and in the lower right R unit region 44, the shared pixel transistors are intensively arranged at the position of R1 pixel.

On the other hand, in FIG. 10, there are four B unit regions 51 to 54 as the same color unit regions of B. Then, in the upper left B unit region 51 among the four B unit regions, the shared pixel transistors are intensively arranged at the position of B1 pixel, and in the upper right B unit region 52, the shared pixel transistors are intensively arranged at the position of B2 pixel. In addition, in the lower left B unit region 53, the shared pixel transistors are intensively arranged at the position of B3 pixel, and in the lower right B unit region 54, the shared pixel transistors are intensively arranged at the position of B1 pixel.

In this way, by intensively arranging the shared pixel transistors in one predetermined pixel among four pixels in the same color unit regions of R or B, it is possible to maximize the area of photodiodes PD in the G pixel of which the number is largest, without causing the loss of pixels. Generally, in the Bayer array, resolution information and color information of G are acquired from the G pixel of which the number is largest, and color information is acquired from the R pixel and B pixel of which the numbers are small. According to the first example of arrangement, since the area of the photodiode PD can be maximized without causing the loss of pixels in the G pixel which acquires the resolution information, high sensitivity and increase in a saturation charge amount can be realized, and thus, it is possible to improve the pixel characteristics.

By performing the processing in such a manner that the ratio of R, G, and B is to be R:G:B=3:8:3, the color information of R or B of the pixels 2 where the shared pixel transistors are intensively arranged can be obtained by interpolation between the color information of the remaining three pixels of the same color.

5.2 A Second Example of Arranging Shared Pixel Transistors

Figure 11:
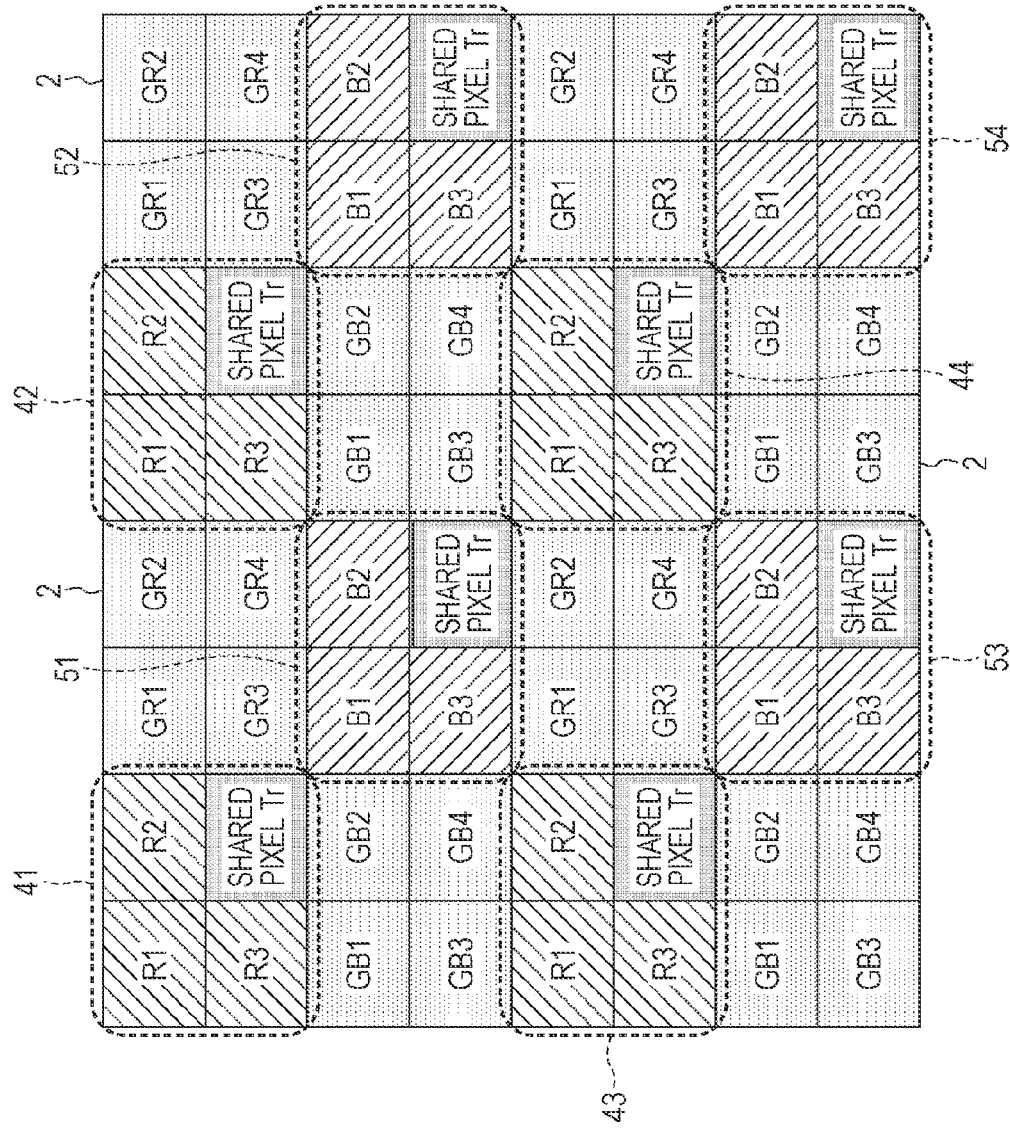
FIG. 11 is a diagram illustrating a second example of arranging the shared pixel transistor.

FIG. 11 is a diagram illustrating a second example of arranging the shared pixel transistors in the pixel array unit 3.

The second example of arrangement is similar to the first example of arrangement described above in the point that the shared pixel transistors are intensively arranged in one pixel of R pixels and one pixel of B pixels in the same color unit.

However, it is different from the first example of arrangement in the point that the pixel where the shared pixel transistors are intensively arranged among four pixels of R or B in the same color unit is determined by a predetermined regulation.

In the second example of arrangement, the shared pixel transistors are intensively arranged in the same pixel position of four adjacent same color unit regions.

That is, in FIG. 11, in any of the four adjacent R unit regions 41 to 44, the shared pixel transistors are intensively arranged in the lower right pixel position of R4. In addition, similarly to the four adjacent B unit regions of 51 to 54 which are the same color unit, the shared pixel transistors are intensively arranged in the lower right pixel position of B4 in any of the four adjacent B unit regions of 51 to 54.

In this way, when the shared pixel transistors are intensively arranged in the same pixel position among the four pixels in the same color unit regions of R or B, the arrangement of the shared pixel transistors viewed from the same color unit region of GR and the arrangement of the shared pixel transistors viewed from the same color unit region of GB are the same. As a result, an influence of oblique incident light from the pixel 2 where the shared pixel transistors are arranged becomes the same in the GB pixel and GR pixel, and thus, it is possible to minimize the difference in sensitivity between the GR pixel and the GB pixel. It is possible to further suppress the influence of the incident light by blocking the light by disposing a black filter which does not transmit visible light or a metal layer in the pixel where the shared pixel transistors are arranged.

As disclosed in Japanese Unexamined Patent Application Publication No. 2008-172580, in the general Bayer array in which the R pixel, GR pixel, GB pixel, and the B pixel are arranged in one pixel unit, for example, the shared pixel transistors are assumed to be intensively arranged in the pixel position of the B pixel, and the B pixel is adjacent to the GR pixel in a vertical direction, and to the GB pixel in a horizontal direction. Therefore, since the B pixel is adjacent to the GR pixel and GB pixel in different directions, the difference in sensitivity between the GR pixel and the GB pixel due to the oblique incident light easily occurs, a difference occurs in the G pixels of the same color, and there is a case in which stripes may be seen.

By arranging the R pixels, GR pixels, GB pixels, and B pixels in the Bayer array with four pixels of vertical 2 pixels× horizontal 2 pixels as the same color unit, as described above, the arrangement of the shared pixel transistors with respect to the GR pixel and the arrangement of the shared pixel transistors with respect to the GB pixel can be the same, and thus, it is possible to minimize the difference in sensitivity between the GR pixel and GB pixel.

5.3 A Third Example of Arranging Shared Pixel Transistors

Figure 12:
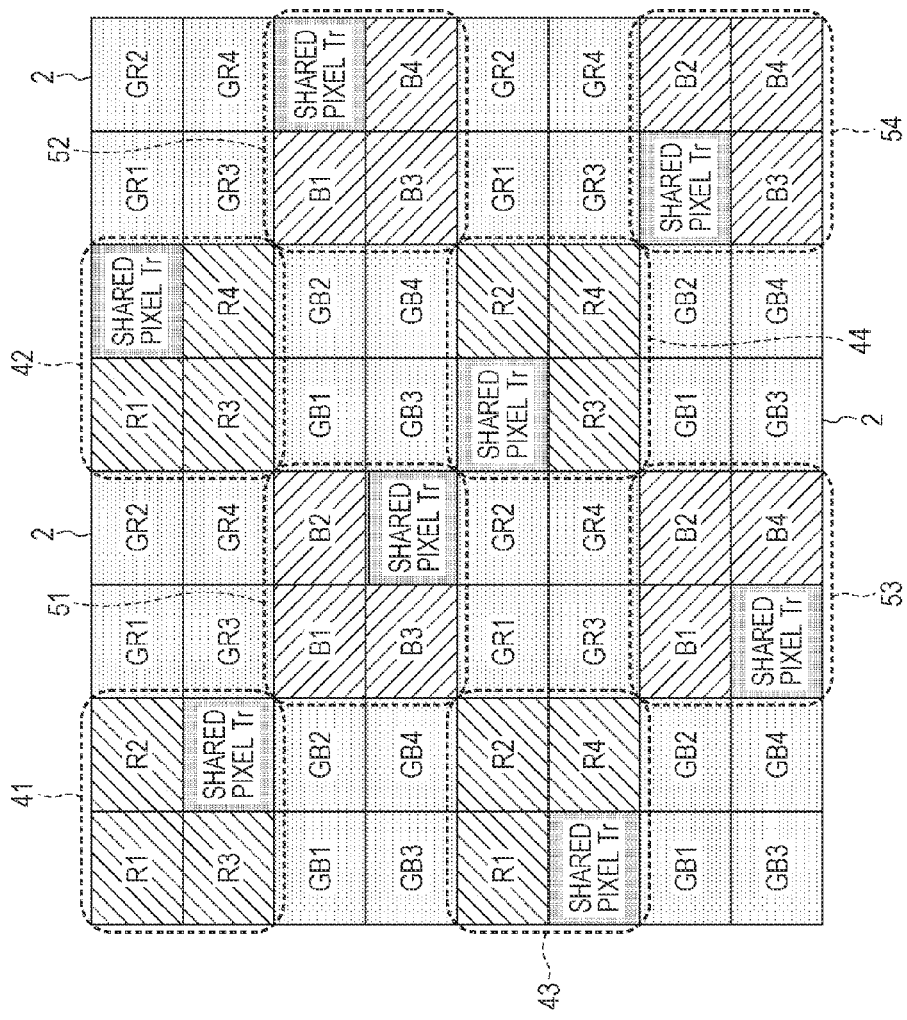
FIG. 12 is a diagram illustrating a third example of arranging the shared pixel transistor.

FIG. 12 is a diagram illustrating a third example of arranging the shared pixel transistors in the pixel array unit 3.

The third example of arrangement is similar to the first example and the second example of arrangements described above in the point that the shared pixel transistors are intensively arranged in one pixel of R pixels and one pixel of B pixels in the same color unit.

However, it is different from the first example and the second example of arrangements in the point that the pixel where the shared pixel transistors are intensively arranged among four pixels of R or B in the same color unit is determined by a predetermined regulation which is different from that in the second example of arrangement.

In the third example of arrangement, the shared pixel transistors are intensively arranged in mutually different pixel position of four adjacent same color unit regions.

That is, in FIG. 12, among the four adjacent R unit regions 41 to 44, in the upper left R unit region 41, the shared pixel transistors are intensively arranged in the pixel position of R4, and in the upper right R unit region 42, the shared pixel transistors are intensively arranged in the pixel position of R2. In addition, in the lower left R unit region 43, the shared pixel transistors are intensively arranged in the pixel position of R3, and in the lower right R unit region 44, the shared pixel transistors are intensively arranged in the pixel position of R1.

In other words, with respect to the four adjacent R unit regions 41 to 44, the pixel position of R1, the pixel position of R2, the pixel position of R3, and the pixel position of R4 are selected once respectively as the arrangement position of the shared pixel transistors.

Similarly, with respect to the four adjacent B unit regions 51 to 54 which are the same color unit regions of B, the pixel position of B1, the pixel position of B2, the pixel position of B3, and the pixel position of B4 are selected once respectively as the arrangement position of the shared pixel transistors.

That is, among the four adjacent B unit regions 51 to 54, in the upper left B unit region 51, the shared pixel transistors are intensively arranged in the B4 pixel position, in the upper right B unit region 52, the shared pixel transistors are intensively arranged in the B2 pixel position, in the lower left B unit region 53, the shared pixel transistors are intensively arranged in the B3 pixel position, and in the lower right B unit region 54, the shared pixel transistors are intensively arranged in the B1 pixel position.

In this way, by intensively arranging the shared pixel transistors in the mutually different pixel positions of the four adjacent same color unit regions, it is difficult for the influence of the shared pixel transistors to appear as stripes because the pixel positions that do not receive the light are equally arranged with a good balance, and it is possible to make the influence of the shared pixel transistors inconspicuous. In addition, in a case where the color information in the pixel position where the shared pixel transistors are intensively arranged is interpolated, there are advantages in interpolation since the color information in the same position of the other adjacent same color unit regions can be used as a reference.

As described above, in the solid state imaging device 1 in FIG. 1, the R pixel, GR pixel, GB pixel, and B pixel are arranged so as to be the Bayer array with the four pixels of vertical 2 pixels×horizontal 2 pixels as the same color unit that receives light of the same color. Then, among each of the same color unit regions of R, GR, GB, and B, the shared pixel transistors are intensively arranged in one pixel of R pixels and one pixel of B pixels.

In this way, since the area of the photodiode PD of the G pixel can be maximized, high sensitivity and increase in the saturation charge amount can be realized, and thus, it is possible to improve the pixel characteristics.

In addition, according to the configuration in which the shared pixel transistors are arranged in the present technology, the photodiode PD and the transfer transistor TG are omitted in the pixel where the shared pixel transistors are arranged. Accordingly, the configuration can be applied to the solid state imaging device of both a front-surface irradiation type and a back-surface irradiation type.

Therefore, according to the configuration of arranging the shared pixel transistors in the present technology, the area of the photodiode can be expanded, and it is possible to realize the configuration that can be used in both of the front-surface irradiation type and the back-surface irradiation type.

In addition, since the shared pixel transistors are intensively arranged in one pixel where the photodiode PD and the transfer transistor TG are omitted, a degree of freedom in designing the shared pixel transistors can be increased, and it is possible to improve the characteristics of the shared pixel transistors. As a result, the size of the amplification transistor 23 can be increased, thus noise reduction can be expected.

Another Example of Forming the on-Chip Lens

Figure 13:
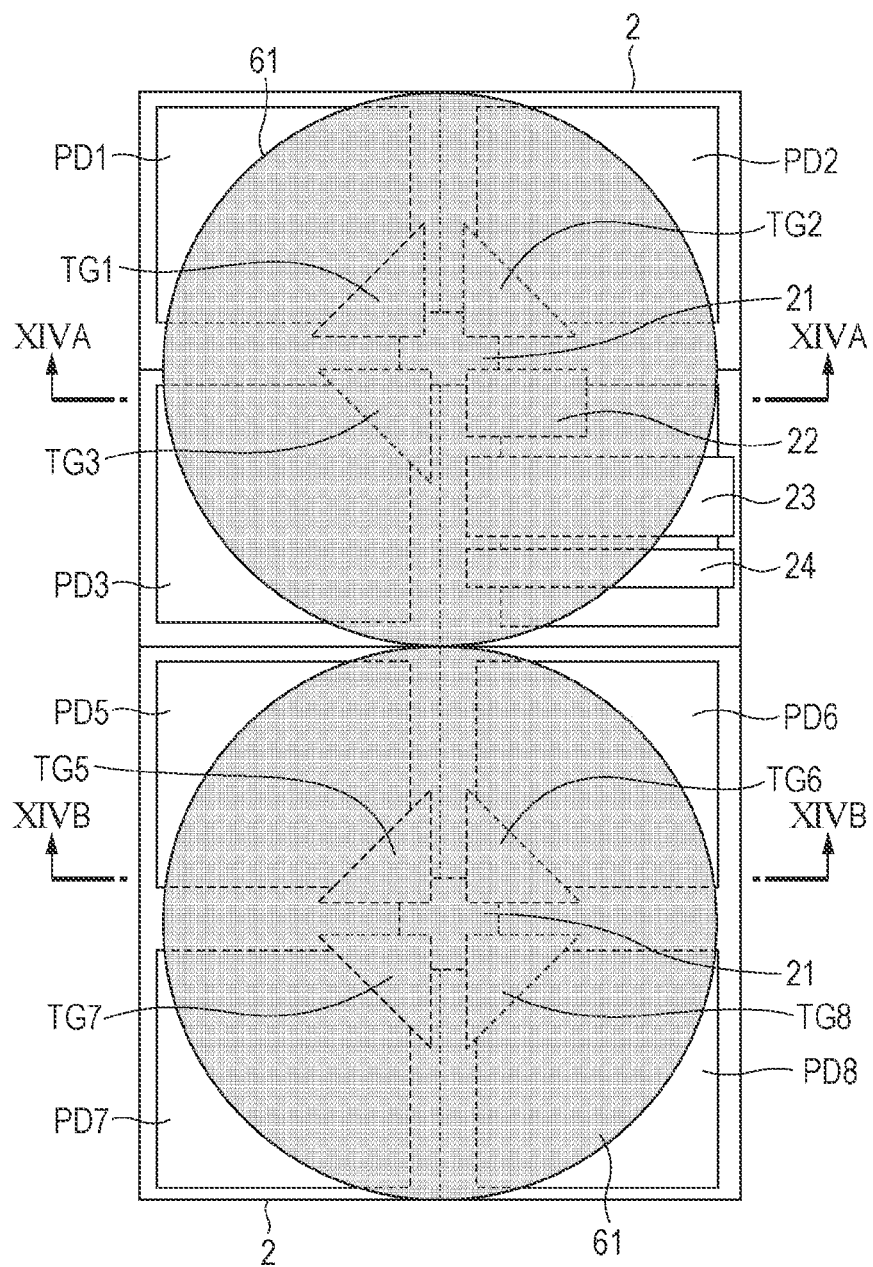
FIG. 13 is a diagram illustrating another example of forming the on-chip lens.

FIG. 13 illustrates another example of forming the on-chip lens in the pixel array unit 3. In FIG. 13, the on-chip lens is illustrated in superimposition on the pixel layout where the signal line is omitted not to be illustrated.

In the initial example illustrated in FIG. 9, an on-chip lens 31 is formed for each pixel 2. However, in FIG. 13, an on-chip lens 61 is formed on four pixels which are the same color unit.

The configuration in which an on-chip lens 61 is formed on four pixels of a same color unit in this way can be adopted to the solid state imaging device of both of the front-surface irradiation type and the back-surface irradiation type. However, in a case of the configuration of the front-surface irradiation type, it is necessary to block the light for the pixel where the shared pixel transistors are arranged.

Figure 14A:
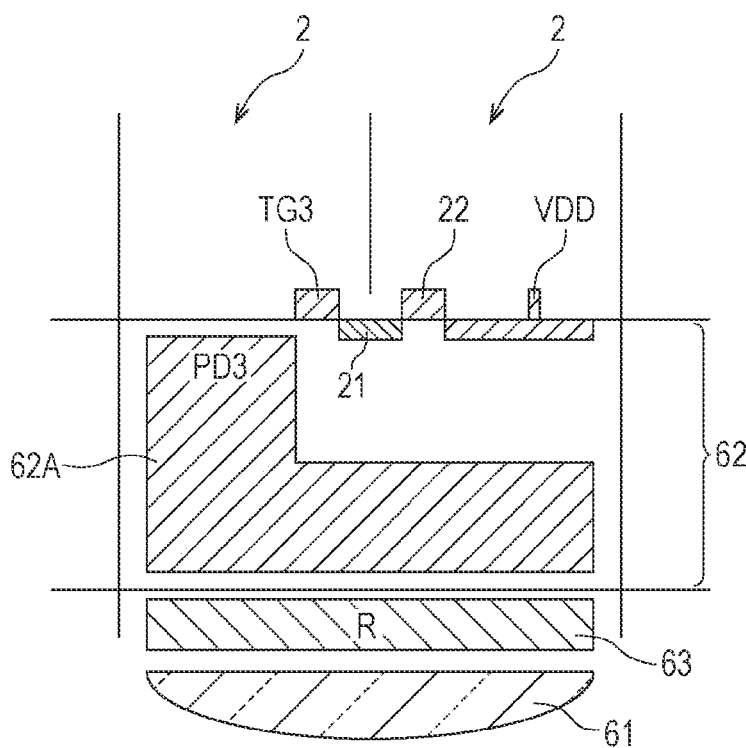
FIG. 14A and FIG. 14B are predetermined cross-sectional views of FIG. 13.
Figure 14B:
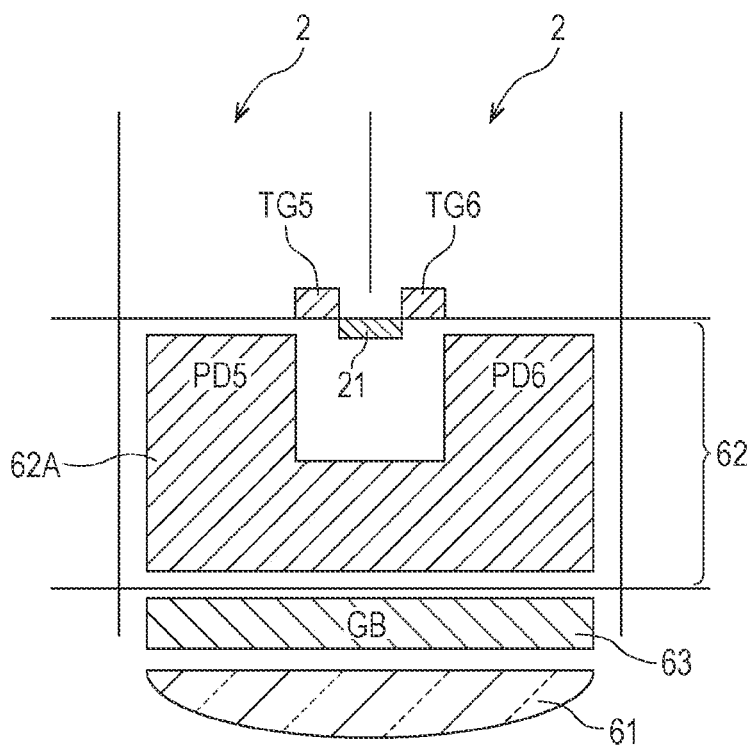

On the other hand, in a case where the configuration in which one on-chip lens 61 is formed on four pixels of a same color unit like this is adapted to the solid state imaging device of the back-surface irradiation type, the blocking of the light is not necessary, and further, as illustrated in FIGS. 14A and 14B, it is possible to configure in such a manner that an impurity region 62A of the photodiode PD of four pixels of the same color unit is connected in the region of the light incident side.

FIG. 14A illustrates a cross-sectional view seen from the line XIVA-XIVA in FIG. 13 and FIG. 14B illustrates a cross-sectional view seen from the line XIVB-XIVB in FIG. 13.

As illustrated in FIG. 14A, in a silicon layer 62 of the pixel 2 where the shared pixel transistors are arranged, the impurity region 62A of the photodiode PD3 is formed so as to extend to the bottom side of the layer where the source region and drain region of the reset transistor 22 are formed.

In addition, as illustrated in FIG. 14B, the impurity regions 62A of the photodiode PD5 and the photodiode PD6 formed in the silicon layer 62 are also mutually connected in the rear surface side region near the color filter 63 and the on-chip lens 61.

In addition, even though not illustrated, the impurity regions 62A of the photodiodes PD in the vertical direction (for example, PD1, PD3, and the like) are also mutually connected in the rear surface side region near the color filter 63 and the on-chip lens 61.

In a case where one on-chip lens 61 is formed on the four pixels of the same color unit, by the impurity region 62A of the photodiodes PD of four pixels of the same color unit as in FIG. 13 being mutually connected in the rear surface side near the color filter 63 and the on-chip lens 61 of the silicon layer 62, an opening region of the photodiode PD can be enlarged, and thus, it is possible to further improve a light receiving sensitivity.

Modification Example

In the example described above, the example of intensively arranging all the shared pixel transistors in the R pixel and the B pixel among the R pixel, GR pixel, GB pixel, and B pixel arranged in the same color unit as the Bayer array is described. However, all the shared pixel transistors may be intensively arranged in the GR pixel and the GB pixel.

That is, in the configuration of arranging the shared pixel transistors in the present technology, it is possible to configure in such a manner that all the shared pixel transistors are intensively arranged in the pixel of at least one color among the R pixel, GR pixel, GB pixel, and B pixel arranged in the same color unit as the Bayer array.

Figure 15:
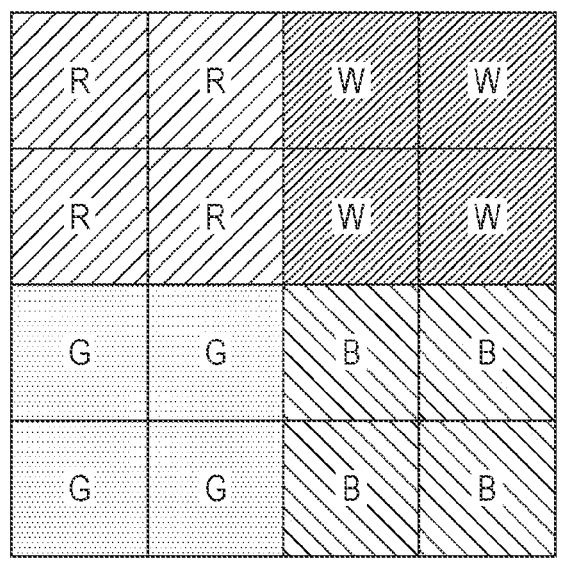
FIG. 15 is a diagram illustrating an example of a color combination of the color filters.

In addition, the configuration of arranging the shared pixel transistors in the present technology can be applied to a combination of color filters of any colors. Not being limited to the combination of colors R, GR, GB, and B described above, for example, as illustrated in FIG. 15, the configuration may be applied to the combination of colors red (R), white (W), green (G), and blue (B). In a case of arraying the pixels in a combination of R, W, G, and B as illustrated in FIG. 15, similar to the examples described above, for example, the entire shared pixel transistors can be intensively arranged in one pixel of the R pixel and the B pixel.

6. A Configuration Example of an Electronic Apparatus

The present technology is not limited to the application to the solid state imaging device. That is, the present technology is generally applicable to electronic apparatuses in which an image capturing unit (a photoelectric conversion unit) uses the solid state imaging device, such as an imaging device like a digital still camera and a video camera, a mobile terminal device having an imaging function, and a copying machine in which an image reading unit uses the solid state imaging device. The solid state imaging device may have a shape of being formed in one chip or may have a module shape in which the imaging unit and the signal processing or the optical system are collectively packaged, and which has an imaging function.

Figure 16:
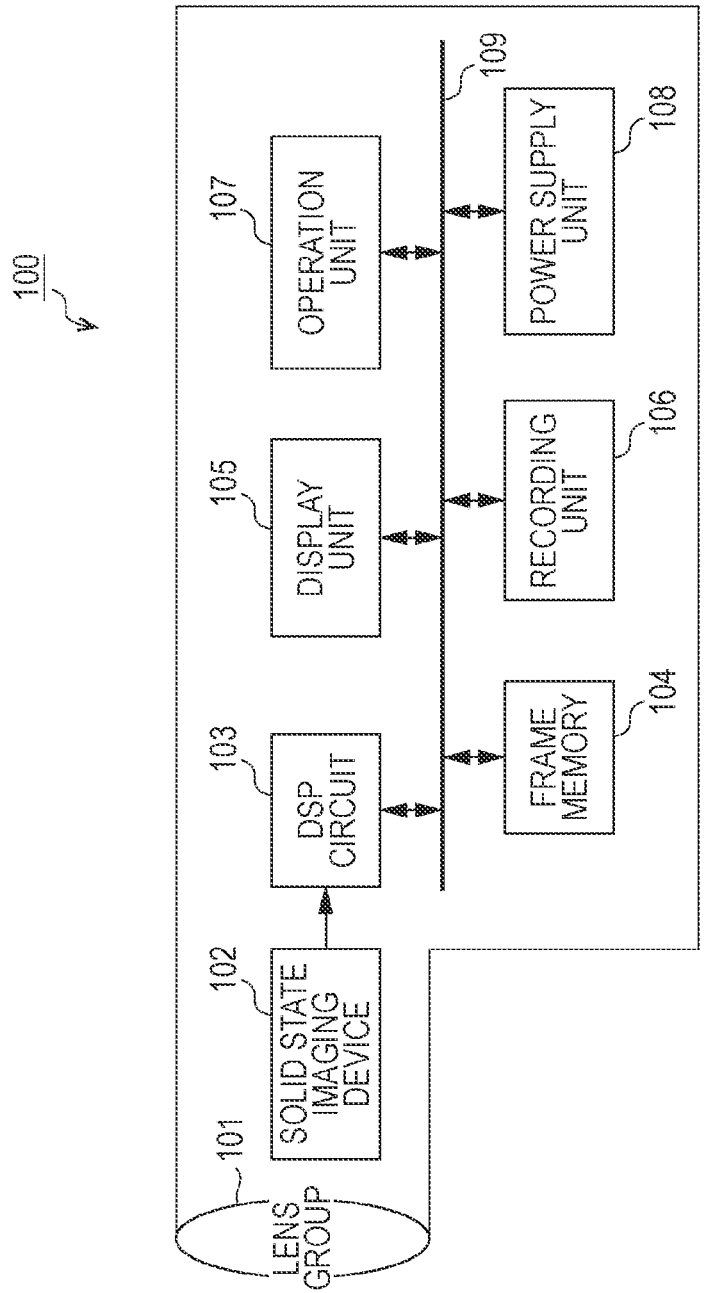
FIG. 16 is block diagram illustrating a configuration example of an imaging device as an electronic apparatus to which the present technology is applied.

FIG. 16 is block diagram illustrating a configuration example of an imaging device as an electronic apparatus to which the present technology is applied.

An imaging device 100 in FIG. 16 includes an optical unit 101 made of a group of lenses, a solid state imaging device (imaging device) 102 in which the configuration of the solid state imaging device 1 in FIG. 1 is adapted, and a digital signal processing (DSP) circuit 103 which is a camera signal processing circuit. In addition, the imaging device 100 also includes a frame memory 104, a display unit 105, a recording unit 106, an operation unit 107, and a power supply unit 108. The DSP circuit 103, the frame memory 104, the display unit 105, the recording unit 106, the operation unit 107, and the power supply unit 108 are connected to each other via a bus line 109.

The optical unit 101 captures incident light (image light) from the object and forms an image on the imaging surface of the solid state imaging device 102. The solid state imaging device 102 converts the incident light amount formed as the image on the imaging surface by the optical unit 101 to an electric signal in units of pixels and outputs the electrical signal as a pixel signal. As the solid state imaging device 102, the solid state imaging device 1 in FIG. 1 can be used, that is, the solid state imaging device in which color filters of a plurality of colors are arrayed with four pixels of vertical 2 pixels×horizontal 2 pixels as the same color unit that receives light of the same color, and which has the shared pixel structure, and thus, in which the shared pixel transistors are intensively arranged in one predetermined pixel in the unit of sharing.

The display unit 105, for example, is made from a panel type display device such as a liquid crystal panel or an organic electro luminescence (EL) panel, and displays a moving image or a still image imaged by the solid state imaging device 102. The recording unit 106 records the moving image or the still image imaged by the solid state imaging device 102 in the recording medium such as a hard disk or a semiconductor memory.

The operation unit 107 issues an operation instruction for various functions of the imaging device 100 due to a user's operation. The power supply unit 108 appropriately supplies various powers which are the operation power of the DSP circuit 103, the frame memory 104, the display unit 105, the recording unit 106, and the operation unit 107 to each of those supply targets.

As described above, by using the solid state imaging device 1 in the embodiments described above as the solid state imaging device 102, the area of the photodiode PD can be expanded and high sensitivity can be realized. Therefore, the quality of the imaged image can be improved in the imaging device 100 for a camera module used for a video camera, a digital still camera, and moreover a mobile device such as a mobile phone.

In addition, the present technology is not limited to being applied to the solid state imaging device that detects and images the distribution of an incident light amount of visible light as the image, but is widely applicable to solid state imaging devices such as: a solid state imaging device that images the distribution of incident amount of X-rays, infrared rays, or particles as the image, and in a broader sense, a solid state imaging device (physical amount distribution detection device) for a finger print sensor that detects and images another physical amount such as pressure or electrostatic capacitance as the image.

The embodiment of the present technology is not limited to the embodiments described above, and various modifications can be made without departing from the scope of the technology.

The present technology can have configurations as follows.
(1) A solid state imaging device includes:
a pixel array unit in which color filters of a plurality of colors are arrayed with four pixels of vertical 2 pixels×horizontal 2 pixels as a same color unit that receives light of the same color, shared pixel transistors that are commonly used by a plurality of pixels are intensively arranged in one predetermined pixel in a unit of sharing, and a color of the color filter of a pixel where the shared pixel transistors are intensively arranged is a predetermined color among the plurality of colors.
(2) The solid state imaging device according to above (1),
in which the plurality of colors are R, G, and B, and
in which the color filters of the plurality of colors are arrayed as the Bayer array.
(3) The solid state imaging device according to any one of above (1) or (2),
in which the unit of sharing is eight pixels made from the adjacent same color units of two colors.
(4) The solid state imaging device according to any one of above (1) to (3),
in which the shared pixel transistors are intensively arranged in one pixel of R or B.
(5) The solid state imaging device according to any one of above (1) to (4),
in which a position of the one pixel where the shared pixel transistors are intensively arranged is a random position in the same color unit of the predetermined color in the pixel array unit.
(6) The solid state imaging device according to any one of above (1) to (4),
in which the position of the one pixel where the shared pixel transistors are intensively arranged is the same pixel position in the regions of four adjacent same color units of the predetermined color in the pixel array unit.
(7) The solid state imaging device according to any one of above (1) to (4),
in which the position of the one pixel where the shared pixel transistors are intensively arranged is a mutually different pixel position in the regions of four adjacent same color units of the predetermined color in the pixel array unit.
(8) The solid state imaging device according to any one of above (1) to (7),
in which the shared pixel transistors are a reset transistor, an amplification transistor, and a selection transistor.
(9) The solid state imaging device according to any one of above (1) to (8), is of back-surface irradiation type.
(10) The solid state imaging device according to above (9),
in which an impurity region of the photodiode is also formed on the one pixel where the shared pixel transistors are intensively arranged.
(11) The solid state imaging device according to any one of above (1) to (10),
in which one on-chip lens is formed on the same color unit.
(12) The solid state imaging device according to any one of above (1) to (11),
in which impurity regions of four pixels of the photodiodes in the same color unit are connected.
(13) The solid state imaging device according to any one of above (1) to (12),
in which the plurality of colors are any of W, R, G, and B.
(14) An electronic apparatus includes:
a solid state imaging device that has a pixel array unit in which color filters of a plurality of colors are arrayed with four pixels of vertical 2 pixels×horizontal 2 pixels as a same color unit that receives light of the same color, shared pixel transistors that are commonly used by a plurality of pixels are intensively arranged in one predetermined pixel in a unit of sharing, and a color of the color filter of pixel where the shared pixel transistors are intensively arranged is a predetermined color among the plurality of colors.

It should be understood by those skilled in the art that various modifications, combinations, sub-combinations and alterations may occur depending on design requirements and other factors insofar as they are within the scope of the appended claims or the equivalents thereof.

What is claimed is:

1. A solid state imaging device comprising:
a pixel array unit in which color filters of a plurality of colors are arrayed with four pixels of vertical 2 pixels× horizontal 2 pixels as a same color unit that receives light of the same color, shared pixel transistors that are commonly used by a plurality of pixels are intensively arranged in one predetermined pixel in a unit of sharing, and a color of the color filter of a pixel where the shared pixel transistors are intensively arranged is a predetermined color among the plurality of colors;
wherein all of the shared pixel transistors are intensively arranged in only one predetermined pixel out of the commonly used plurality of the pixels, wherein the one predetermined pixel is one of R or B.

2. The solid state imaging device according to claim 1,
wherein the plurality of colors are R, G, and B, and
wherein the color filters of the plurality of colors are arrayed as a Bayer array.

3. The solid state imaging device according to claim 1,
wherein the unit of sharing is eight pixels made from the adjacent same color units of two colors.

4. The solid state imaging device according to claim 1,
wherein the shared pixel transistors are intensively arranged in one pixel of R or B.

5. The solid state imaging device according to claim 1,
wherein a position of the one pixel where the shared pixel transistors are intensively arranged is a random position in the same color unit of the predetermined color in the pixel array unit.

6. The solid state imaging device according to claim 1,
wherein the position of the one pixel where the shared pixel transistors are intensively arranged is the same pixel position in the regions of four adjacent same color units of the predetermined color in the pixel array unit.

7. The solid state imaging device according to claim 1,
wherein the position of the one pixel where the shared pixel transistors are intensively arranged is a mutually different pixel position in the regions of four adjacent same color units of the predetermined color in the pixel array unit.

8. The solid state imaging device according to claim 1, wherein the shared pixel transistors are a reset transistor, an amplification transistor, and a selection transistor.

9. The solid state imaging device according to claim 1 that is back-surface irradiation type.

10. The solid state imaging device according to claim 9, wherein an impurity region of the photodiode is also formed on the one pixel where the shared pixel transistors are intensively arranged.

11. The solid state imaging device according to claim 1, wherein one on-chip lens is formed on the same color unit.

12. The solid state imaging device according to claim 1, wherein impurity regions of four pixels of the photodiodes in the same color unit are connected.

13. The solid state imaging device according to claim 1, wherein the plurality of colors are any of the W, R, G, and B.

14. An electronic apparatus comprising:
a solid state imaging device that includes a pixel array unit in which color filters of a plurality of colors are arrayed with four pixels of vertical 2 pixels×horizontal 2 pixels as a same color unit that receives light of the same color, shared pixel transistors that are commonly used by a plurality of pixels are intensively arranged in one predetermined pixel in a unit of sharing, and a color of the color filter of pixel where the shared pixel transistors are intensively arranged is a predetermined color among the plurality of colors; wherein all of the shared pixel transistors are intensively arranged in only one predetermined pixel out of the commonly used plurality of the pixels, wherein the one predetermined pixel is one of R or B.

\* \* \* \* \*